United States Patent [19]

Yamanishi et al.

[11] Patent Number: 5,512,156
[45] Date of Patent: Apr. 30, 1996

[54] SPUTTERING ELECTRODE

[75] Inventors: Hitoshi Yamanishi, Higashiosaka; Isamu Aokura, Osaka; Toshiyuki Suemitsu, Mino; Takahiro Takisawa, Moriguchi, all of Japan

[73] Assignee: Matsushita Electric Industrial Co., Ltd., Osaka, Japan

[21] Appl. No.: 265,019

[22] Filed: Jun. 24, 1994

[30] Foreign Application Priority Data

Jun. 24, 1993 [JP] Japan .................. 5-153234

[51] Int. Cl.⁶ .................................. C23C 14/35
[52] U.S. Cl. .................. 204/298.16; 204/298.2
[58] Field of Search .............. 204/298.16, 298.2

[56] References Cited

U.S. PATENT DOCUMENTS

| 3,956,093 | 5/1976 | McLeod | 204/192.12 |
| 5,069,772 | 12/1991 | Fritsche et al. | 204/298.12 |
| 5,106,470 | 4/1992 | Takei et al. | 204/192.12 |
| 5,133,850 | 7/1997 | Kukla et al. | 204/298.12 |
| 5,399,253 | 3/1995 | Grünenfelder | 204/298.2 |
| 5,403,457 | 4/1995 | Nago et al. | 204/192.2 |

FOREIGN PATENT DOCUMENTS

| 5-148642 | 6/1993 | Japan | 204/298.2 |
| 6-41740 | 2/1994 | Japan | 204/298.16 |

*Primary Examiner*—Aaron Weisstuch
*Attorney, Agent, or Firm*—Wenderoth, Lind & Ponack

[57] ABSTRACT

A magnetron sputtering electrode assembly which is used in a sputtering system having a rectangular flat-plate target, includes permanent magnets arranged along the longitudinal edges of the target to pass lines of magnetic forces in parallel to the surface of the rectangular flat-plate target, and a driving device for reversing polarity of the magnets to change by 180 degrees the direction of the lines of magnetic force caused by the permanent magnets passing in parallel to the surface of the rectangular flat-plate target.

7 Claims, 8 Drawing Sheets

SPUTTERING ELECTRODE

BACKGROUND OF THE INVENTION

The present invention relates to a sputtering electrode which is used in a sputtering system having a rectangular flat-plate target, which is aimed at improving uniformity of film thickness and film quality of a thin film formed on a substrate surface by sputtering, as well as for improved consumption efficiency of the sputtering target.

As compared with the vacuum deposition process, the sputtering process allows easier thin film formation of high melting point materials and compounds, but has a drawback of lower rates of thin film formation. It is the magnetron sputtering process that has eliminated this drawback and made it possible to mass-produce thin films by sputtering. The magnetron sputtering process has by now spread over a wide range of fields such as semiconductors and electronic components.

The magnetron sputtering electrode used together with a rectangular flat-plate target is one of the sputtering electrodes that are mounted on various types of sputtering systems now in a wide range of use. Included in these sputtering systems are carrousel type sputtering systems which carry out thin film formation while rotating a cylindrical substrate holder on which a large number of substrates have been mounted, large-size moving type sputtering systems which carry out thin film formation by translating relative to a target a flat-plate substrate holder on which a large number of substrates or a single large-area substrate has been placed, and other types of systems.

A conventional magnetron sputtering electrode used together with a rectangular flat-plate target is described below with reference to FIGS. 5, 6, and 7. FIG. 5 is a plan view of a conventional magnetron sputtering electrode 24 used with a rectangular flat-plate target, FIG. 6 is a sectional view taken along the line VI—VI of FIG. 5, and FIG. 7 is a perspective view of FIG. 5. Reference numeral 1 denotes a rectangular flat-plate target, which is fixed to a backing plate 2 with a soldering agent such as indium and mounted on an electrode 4 via an O-ring 3 for vacuum sealing. On the rear side of the target 1, a magnetic circuit 5 for providing magnetron discharge is arranged in such a way that closed lines of magnetic force 6 are formed and moreover at least part of the lines of magnetic force 6 become parallel to the surface of the target 1. As a result, as shown in FIG. 7, a toroidal-type, closed tunnel shaped magnetic field 7 is formed on the surface of the target 1.

The magnetron sputtering electrode 24 together with the rectangular flat-plate target 1 according to the above-described arrangement is now described with respect to its principle of operation, referring to FIGS. 7 and 9. FIG. 9 is a schematic view of a sputtering system in which the above-described sputtering electrode 24 is installed. The sputtering electrode 24 is installed in a vacuum chamber 21 via an insulating material 22, and has a dc or ac power supply 23 connected thereto. For the thin film formation, the vacuum chamber 21 is first evacuated to a high vacuum (approximately $10^{-7}$ Torr) by a vacuum pump 25.

Next, discharge gas 26 such as Ar is introduced through a flow regulator 27, and the interior of the chamber 21 is maintained at a pressure of about $10^{-3}$ to $10^{-2}$ Torr by controlling a conductance valve 28. In this state, if a negative voltage is applied to the sputtering electrode 24 with the rectangular flat-plate target 1 mounted thereon, there occurs magnetron discharge in the vicinity of the electric field and the toroidal-type tunnel-shaped magnetic field 7 of the magnetic circuit 5. Then, the target 1 is sputtered so that sputtered particles are deposited on a substrate 30 mounted on a substrate holder 29. Thus, a thin film is formed thereon.

Unfortunately, the aforementioned magnetron sputtering electrode 24 having the rectangular flat-plate target 1 has increased plasma densities at the portions thereof where the most intense lines of magnetic force pass in parallel to the surface of the target 1. Accordingly, there are formed on the target 1 areas which are sputtered (indicated by reference numeral 8 in FIG. 7, hereinafter referred to as erosion areas) and areas where sputtered particles are redeposited. This causes the target 1 to be non-uniformly eroded. Due to this, in order to ensure uniformity in thickness of thin films formed on the substrate 30 positioned opposite to the target 1, it is necessary to appropriately control the size of the target 1, the magnetic circuit, and the distance between the target 1 and the substrate 30. Generally, a target having a size about two times larger than the length of one side of the substrate is necessary to ensure uniformity of the thickness of the thin films.

Also, as the sputtering proceeds, the target 1 will vary in its erosion area 8 as well as in its configuration, so that the film thickness distribution also varies from (a) to (c) through (b) as shown in FIG. 8. This graph indicates that the film thickness tends to become thinner at the periphery of the substrate as the erosion progresses.

Furthermore, the presence of partial erosion area 8 on the target 1 would also involve non-uniformity of the physical properties of the thin films such as film composition and structure within the substrate surface or among batches, in the case of alloy sputtering or reactive sputtering.

Generally, the usage efficiency of the target 1 is as poor as 20–30%. Moreover, when the target 1 is formed of ferromagnetic material such as iron or cobalt, there are some cases where magnetic leakage fluxes onto the surface of the target 1 cannot be sufficiently obtained to implement the sputtering.

SUMMARY OF THE INVENTION

An object of the present invention is therefore to provide a magnetron sputtering assembly electrode which allows improvement in uniformity of film thickness and film quality on a substrate surface or among batches of thin films formed by a sputtering electrode having a rectangular flat-plate target, improvement in consumption efficiency of the target, and high-speed, efficient sputtering of a ferromagnetic material target.

In accomplishing these and other objects according to one aspect of the present invention, there is provided a magnetron sputtering electrode assembly which is used in a sputtering system having a rectangular flat-plate target, comprising:

permanent magnets arranged along the longitudinal edges of the target to pass lines of magnetic forces in parallel to the surface of the rectangular flat-plate target; and a driving device for reversing the polarity of the magnets so as to change by 180 degrees the direction of the lines of magnetic force caused by the permanent magnets passing in parallel to the surface of the rectangular flat-plate target.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE EMBODIMENTS

Figure 1:
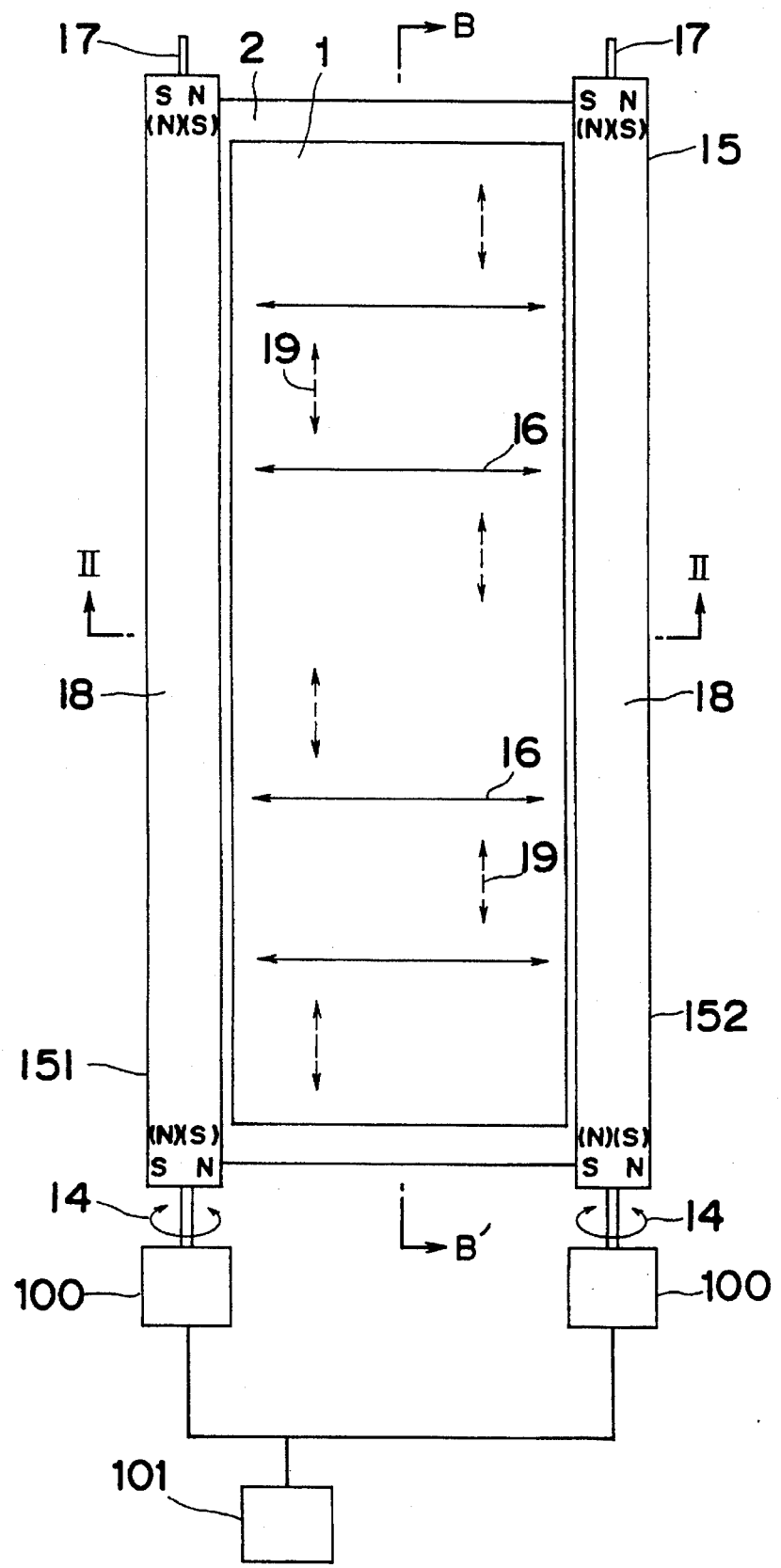
FIG. 1 is a plan view of a part of a sputtering system having a sputtering electrode and a rectangular flat-plate target according to an embodiment of the present invention.

Before the description of the present invention proceeds, it is to be noted that like parts are designated by like reference numerals throughout the accompanying drawings.

A sputtering electrode assembly of an embodiment of the present invention is now described with reference to the accompanying drawings.

Figure 2:
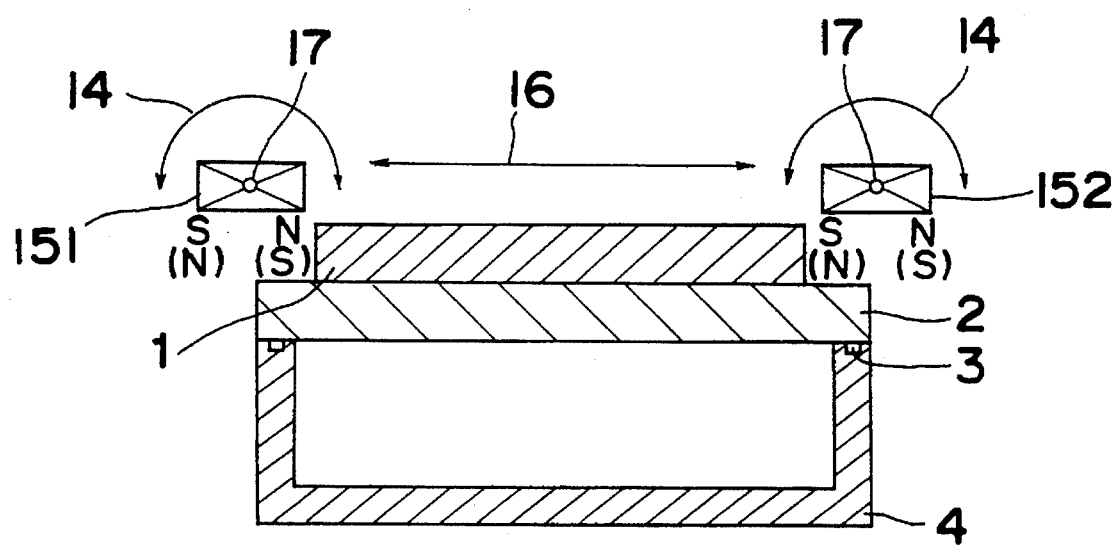
FIG. 2 is a sectional view taken along the line II—II of FIG. 1.

FIG. 1 is a plan view of the sputtering electrode assembly of the embodiment of the present invention, and FIG. 2 is a sectional view taken along the line II—II of FIG. 1.

A magnetic circuit 15 for generation of a magnetic field comprising left-hand magnetic circuit 151 and right-hand magnetic circuit 152 is disposed at two positions, right and left of the sputtering surface of the target 1, in parallel to the longitudinal axis of the target 1. The left-hand magnetic circuit 151 and the right-hand magnetic circuit 152 positioned opposite thereto are each formed of a permanent magnet 18 and arranged in such a way that lines of magnetic force 16 pass from N pole to S pole between the right and left-hand magnetic circuits 151 and 152. The left-hand magnetic circuit 151 and the right-hand magnetic circuit 152 positioned opposite thereto are each further equipped with a magnetic-circuit rotating shaft 17 in the direction of their longitudinal axes. This allows the right and left magnetic circuits 151 and 152 to undergo 180-degree reciprocating movement by a drive device such as air cylinder 100 through control of a controller 101, for example, formed by a control circuit, as indicated by arrows 14.

The sputtering electrode of the present embodiment with the above-described arrangement is installed in a sputtering system having a rectangular flat-plate target, e.g., a conventional magnetron sputtering electrode.

Figure 3:
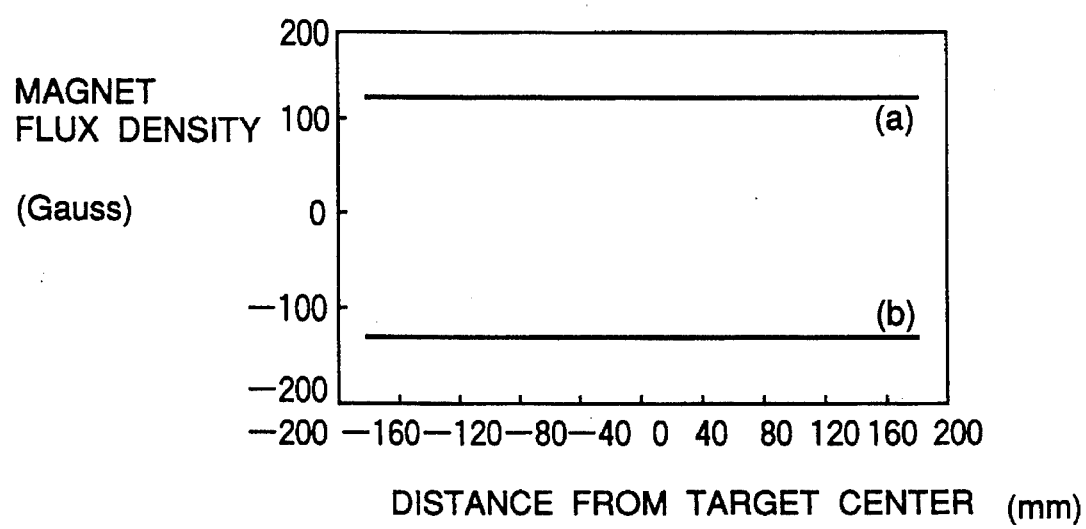
FIG. 3 is a graph of the surface magnetic-field distribution on the target of the sputtering system.

The sputtering system of the present embodiment is so constructed that, for implementation of the sputtering, the lines of magnetic force 16 due to the left-hand magnetic circuit 151 and the right-hand magnetic circuit 152 positioned opposite thereto first pass from left to right with respect to the sputtering surface in the initial state. In this state, the strength of the magnetic field due to the lines of magnetic force normal to the direction of the longitudinal axis of the target 1 and parallel to the target surface on the line B–B' of FIG. 1 is as shown by reference character (a) in FIG. 3.

Figure 10:
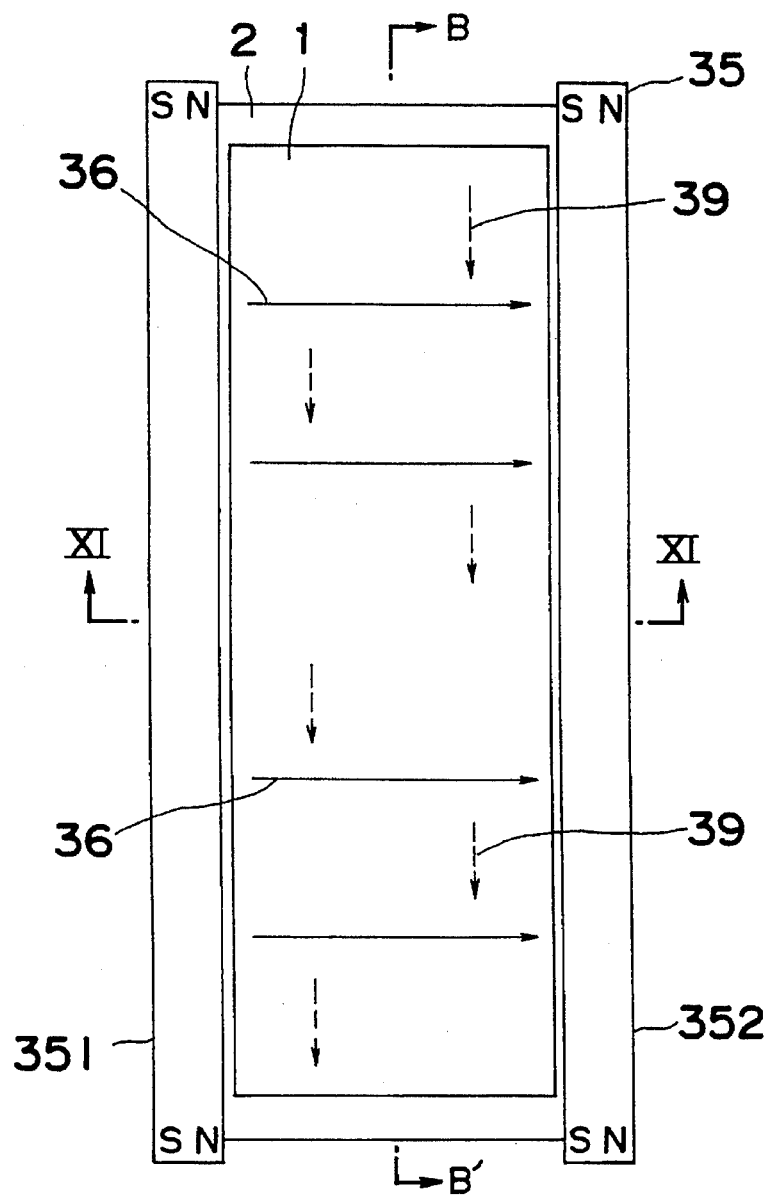
FIG. 10 is a plan view of part of a sputtering system having a sputtering electrode and a rectangular flat-plate target with uniform magnetic field on the target surface.
Figure 11:
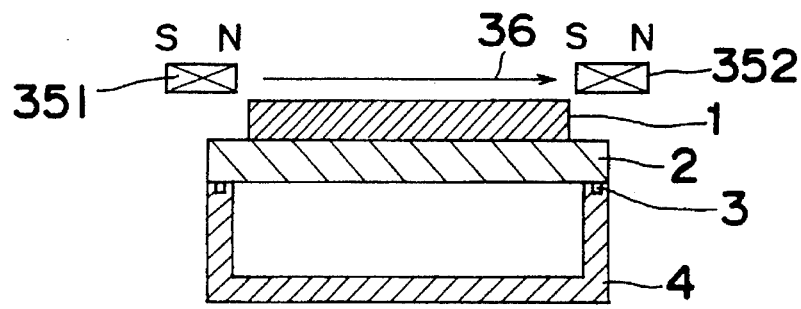
FIG. 11 is a sectional view taken along the line XI—XI of FIG. 10.

One example of a sputtering system is now described for comparison with the above embodiment with reference to FIGS. 10–13. The sputtering system of FIGS. 10–11 has a rectangular flat-plate sputtering electrode in which a magnetic circuit is arranged on the target sputtering surface so that lines of magnetic force parallel to the target 1 can be obtained over the surface of the target 1. FIG. 10 is a plan view of the rectangular flat-plate sputtering electrode, and FIG. 11 is a sectional view taken along the line XI—XI of FIG. 10. It is noted that like members are indicated by like numerals in conjunction with the above-described conventional magnetron sputtering electrode, their description being omitted.

Figure 12:
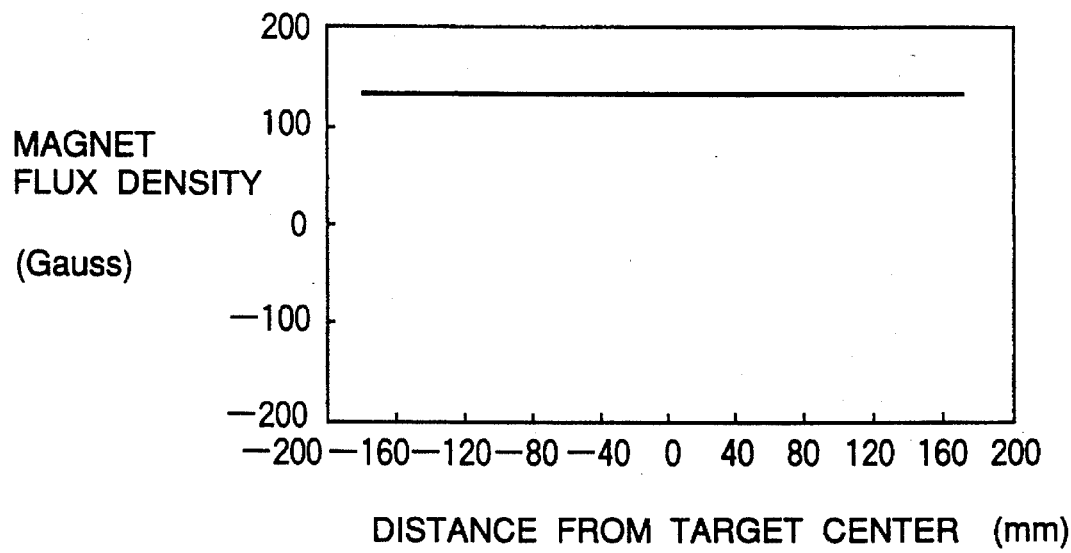
FIG. 12 is a graph of surface magnetic-field distribution on the target of the sputtering system of FIGS. 10–11 with a uniform magnetic field on the target surface.

An N-pole magnet 351 is disposed on one side of the target sputtering surface while an S-pole magnet 352 is disposed on the other side opposite thereto. As a result of this arrangement, such a magnetic circuit is formed that lines of magnetic force 36 pass generally uniformly in parallel to the sputtering surface of the target 1, making it possible to erode the entire surface of the target 1. FIG. 12 shows an example of the strength of magnetic field due to lines of magnetic force normal to the direction of the longitudinal axis of the target 1 and parallel to the surface of the target 1, on the line B–B' of FIG. 10. The sign for magnetic flux density is defined as positive when the lines of magnetic force pass from the left-hand magnetic circuit 351 (N-pole) toward the right-hand magnetic circuit 352 (S-pole) in FIG. 10, and as negative when the lines of magnetic force pass from the right-hand (N-pole) toward the left-hand (S-pole). Also, the distance from the center of the target 1 is so defined that the center line of the target 1 corresponds to zero while the upper side with respect to the sputtering surface is defined as positive and the lower side is defined as negative.

Figure 13:
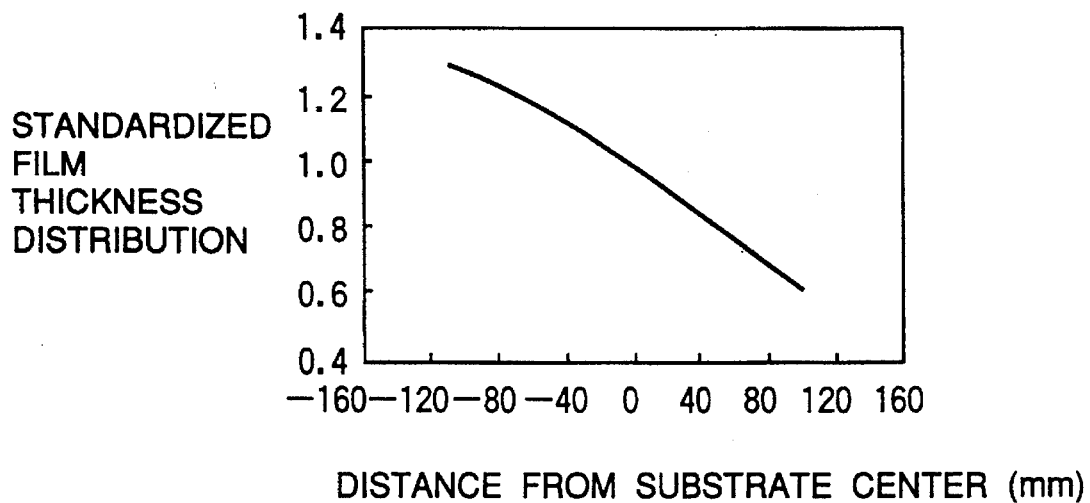
FIG. 13 is a graph of film thickness distribution of the sputtering system of FIGS. 10–11 with a uniform magnetic field on the target surface.

However, since the lines of magnetic force 36 are of the same direction on the entire surface of the target 1 in the above arrangement, spiral movement of electrons due to the magnetic and electric fields is restricted to one direction 39. The further the electrons go in the direction (downward with respect to the sputtering surface), the more the electrons collide with atoms and molecules, causing the plasma density to increase. As a result, the film thickness distribution disadvantageously is of a steep gradient as shown in FIG. 13.

Figure 4:
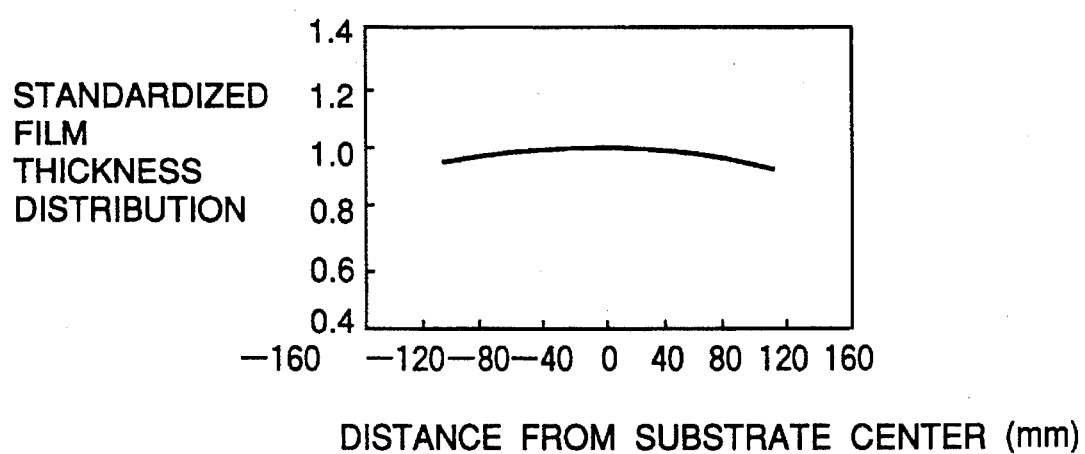
FIG. 4 is a graph of film thickness distribution when the sputtering electrode is used.
Figure 5:
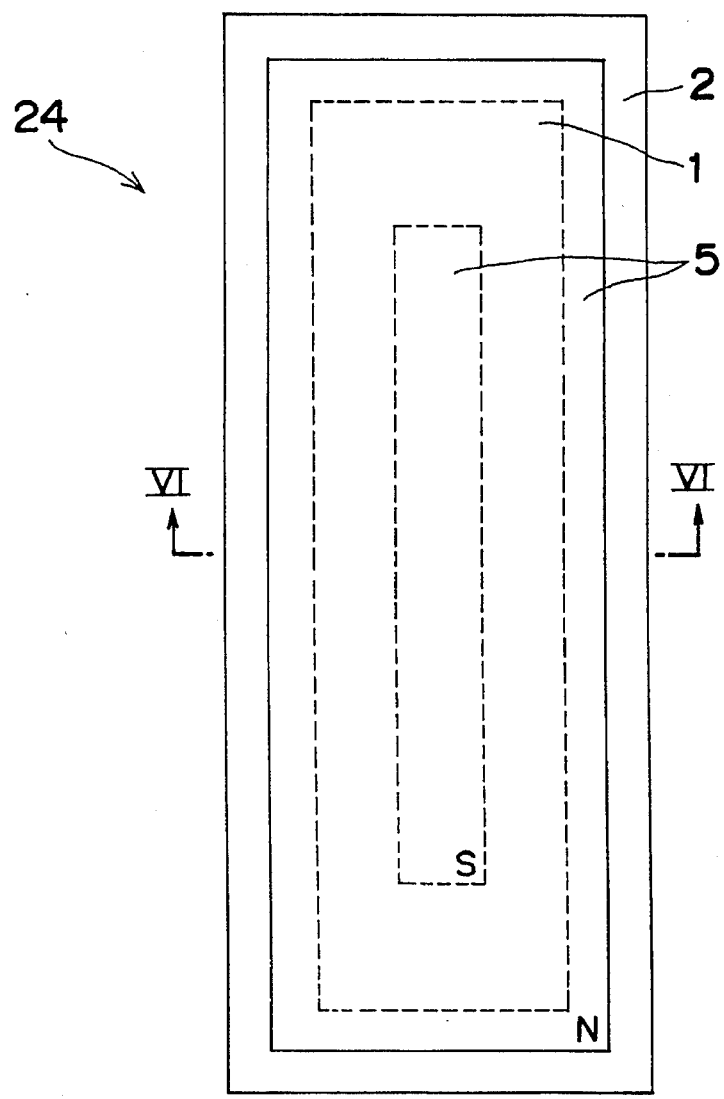
FIG. 5 is a plan view of a conventional magnetron sputtering electrode and a rectangular flat-plate target.
Figure 6:
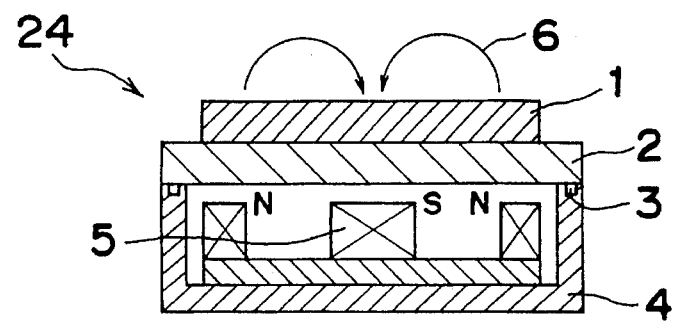
FIG. 6 is a sectional view taken along the line VI—VI of FIG. 5.
Figure 7:
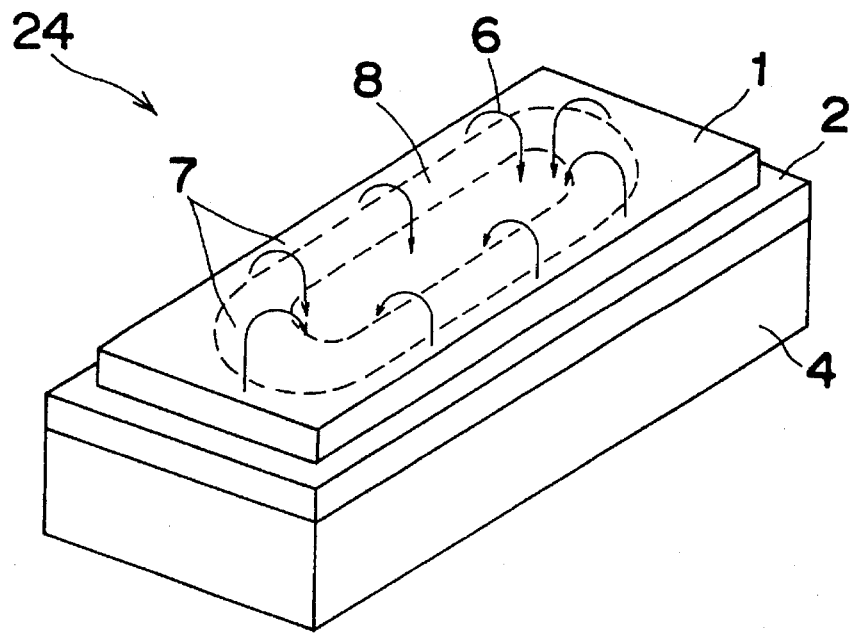
FIG. 7 is a perspective view of the conventional magnetron sputtering electrode having a rectangular flat-plate target.
Figure 8:
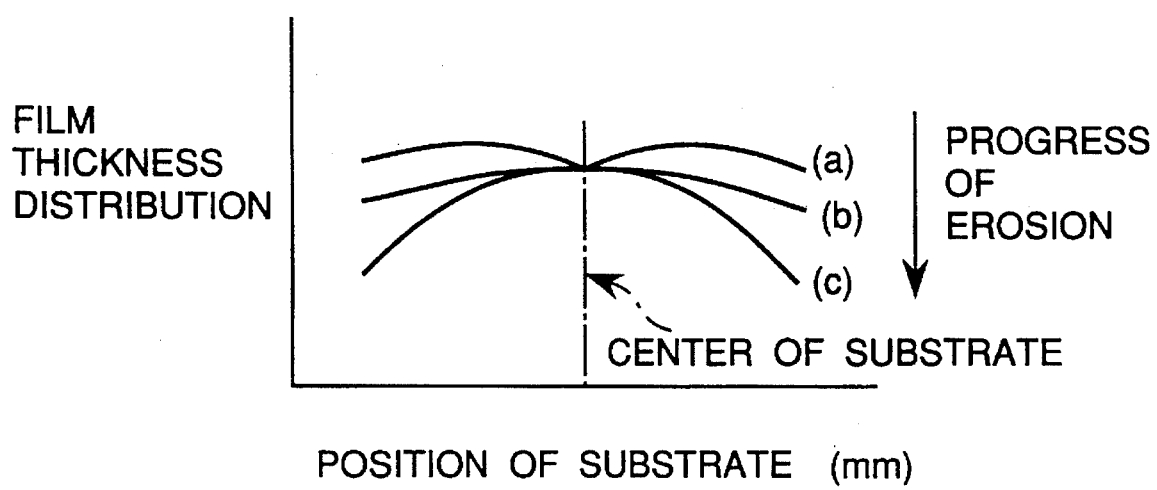
FIG. 8 is a graph of film thickness distribution due to progress of erosion of the target of the conventional magnetron sputtering electrode.
Figure 9:
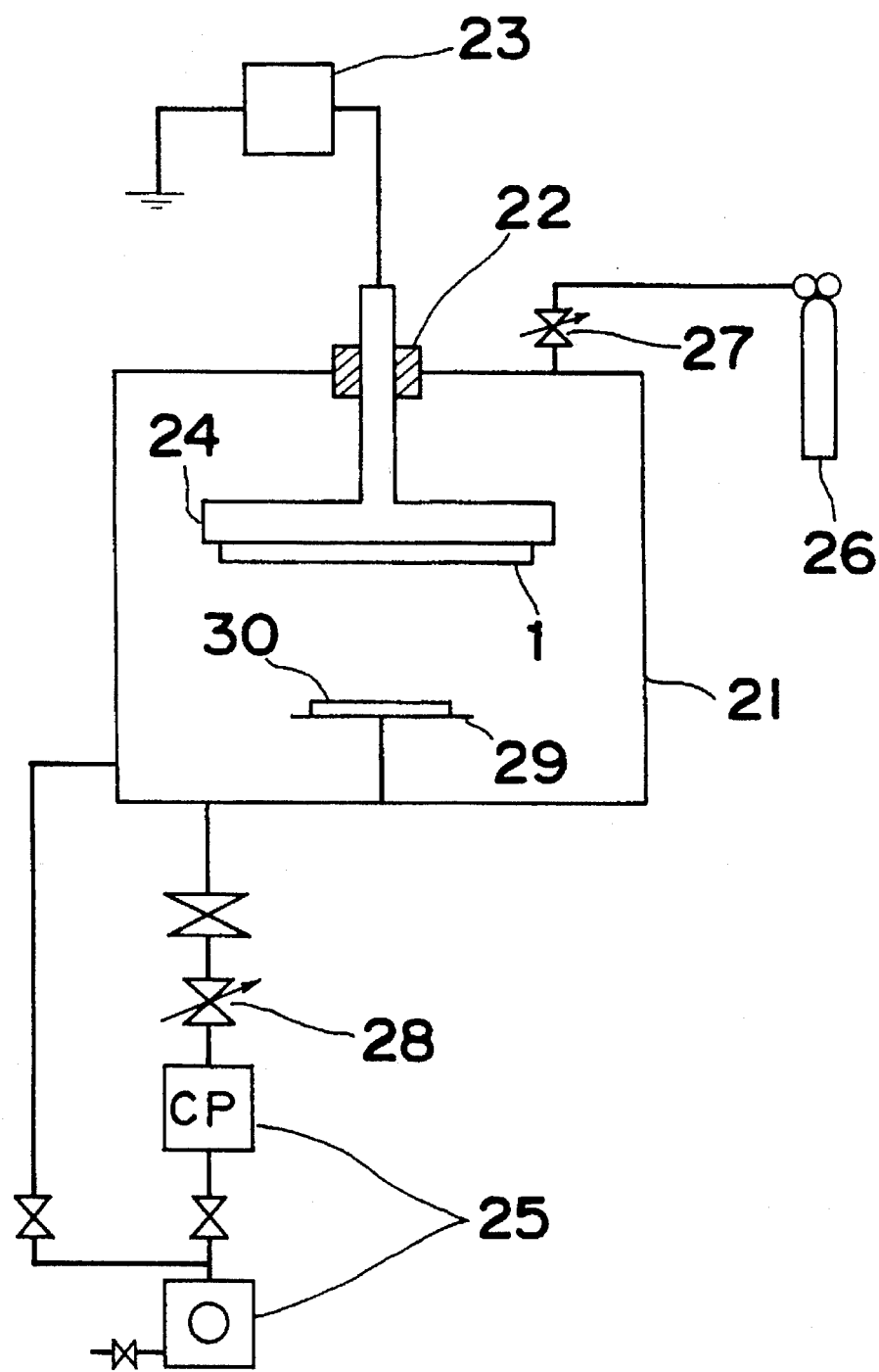
FIG. 9 is a schematic view of a sputtering system in which the sputtering electrode is installed.

When sputtering is effected using the system of FIGS. 1–2 in the same manner as in the system of FIGS. 10–11, the spiral movement of electrons due to the magnetic and electric fields is initially caused only toward the lower side of the sputtering surface of FIG. 1, so that the further down the sputtering surface the electrons go, the more the electrons collide with atoms and molecules, causing the plasma density to be increased. Next, after a specified time elapse, the magnetic-circuit rotating shafts 17 are instantaneously rotated 180 degrees with the right and left-hand magnetic circuits 151 and 152 synchronized with each other by the air cylinders 100 through the control of the controller 101, while the sputtering is maintained. This allows the lines of magnetic force 16 to pass from right to left with respect to the sputtering surface of FIG. 1, causing the spiral movement of electrons due to the magnetic and electric fields to change towards the upper side of the sputtering surface, with the plasma density also increased at the upper side. The strength of magnetic field in this state is equal in strength and opposite in sign (direction) to that of (a) as shown by reference character (b) in FIG. 3. After a further time lapse, the direction of magnetic fluxes is again reversed. The above steps are then repeated until the sputtering is completed. As a result, the spiral movement of electrons due to the magnetic and electric fields will not be restricted to one direction, whereby non-uniformities of plasma are cancelled. Thus, the film thickness distribution is also improved to a substantial extent as shown in FIG. 4.

It is noted that although the strength of the lines of magnetic force has been made constant in the present embodiment, the strength of the lines of magnetic force 16 on the sputtering surface of the target 1 can be partially varied by dividing the magnets 18 that constitute the right and left magnetic circuits 151 and 152.

As described above, according to the present invention, with the above arrangement, since the sputtering electrode comprises a driving device for reversing the polarity of the magnets so that the direction of lines of magnetic force passing parallel to the sputtering surface of the rectangular flat-plate target can be changed by 180 degrees, spiral movement of electrons due to magnetic and electric fields will not be restricted to one direction, whereby non-uniformities of plasma can be cancelled. As a result, uniformity of film thickness and film quality on the substrate surface and among batches of thin films formed can be improved. Also, consumption efficiency of the target can be improved. Furthermore, it becomes feasible to accomplish high speed, efficient sputtering of a ferromagnetic material target.

Moreover, since permanent magnets are used, the system can be less expensive than if electro-magnets are used, can be more compact in structure, and the control operation of the system can be easier than that for electro-magnets.

Although the present invention has been fully described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. A magnetron sputtering electrode assembly having a rectangular flat-plate target with a sputtering surface and opposite longitudinal edges, said magnetron sputtering electrode assembly comprising:

elongated permanent magnets, respectively arranged along the opposite longitudinal edges of the rectangular flat-plate target and outwardly from the opposite longitudinal edges of the rectangular flat-plate target in the transverse direction thereof, for passing lines of magnetic force transversely across the sputtering surface of the rectangular flat-plate target such that the lines of magnetic force are continuously parallel to the entire width of the sputtering surface of the rectangular flat-plate target; and a driving device for reversing the polarity of said permanent magnets to thereby change by 180 degrees the direction of the lines of magnetic force caused by said permanent magnets in parallel to the sputtering surface of the rectangular flat-plate target.

2. A magnetron sputtering electrode assembly as recited in claim 1, wherein said driving device comprises a means for rotating said permanent magnets.

3. A magnetron sputtering electrode assembly as recited in claim 2, wherein said permanent magnets are positioned on the same side of said rectangular flat-plate target as the sputtering surface thereof.

4. A magnetron sputtering electrode assembly as recited in claim 1, wherein said permanent magnets are positioned on the same side of said rectangular flat-plate target as the sputtering surface thereof.

5. The sputtering electrode assembly as claimed in claim 1, further comprising a controller for controlling the reversing operation of the driving device.

6. The sputtering electrode assembly as claimed in claim 5, wherein the controller controls the driving device so as to simultaneously rotate the permanent magnets by 180 degrees.

7. The sputtering electrode assembly as claimed in claim 1, wherein each of said permanent magnet is divided into a plurality of magnet elements extended along the longitudinal direction of the magnet.

* * * * *